United States Patent [19]
Kim

[11] Patent Number: 6,035,008
[45] Date of Patent: Mar. 7, 2000

[54] AUTOMATIC GAIN CONTROL IN DIRECT SEQUENCE SPREAD SPECTRUM COMMUNICATION SYSTEM

[75] Inventor: Sung-Soo Kim, Suwon, Rep. of Korea

[73] Assignee: SamSung Electronics Co., Ltd., Suwon, Rep. of Korea

[21] Appl. No.: 08/944,917

[22] Filed: Oct. 6, 1997

[30] Foreign Application Priority Data

Oct. 5, 1996 [KR] Rep. of Korea ............... 96-44154

[51] Int. Cl.⁷ .................... H04L 27/08; H04B 1/06
[52] U.S. Cl. .................. 375/345; 455/234.1
[58] Field of Search .................. 375/345, 316, 375/200, 206; 455/192.1, 192.2, 257, 266, 234.1, 234.2, 249.1, 250.1

[56] References Cited

U.S. PATENT DOCUMENTS

| | | | |
|---|---|---|---|
| 4,899,364 | 2/1990 | Akazawa et al. | 375/200 |
| 4,953,178 | 8/1990 | Ishigaki | 375/200 |
| 5,001,776 | 3/1991 | Clark | 455/226 |
| 5,105,437 | 4/1992 | Kingston et al. | 375/200 |
| 5,168,505 | 12/1992 | Akazawa et al. | 375/200 |
| 5,233,634 | 8/1993 | Väisänen | 375/320 |
| 5,239,683 | 8/1993 | Usui | 455/63 |
| 5,276,685 | 1/1994 | Kepler et al. | 370/332 |
| 5,347,534 | 9/1994 | Akazawa et al. | 375/200 |
| 5,438,683 | 8/1995 | Durtler et al. | 455/74 |
| 5,481,226 | 1/1996 | Parkes, Jr. | 333/279 |
| 5,493,712 | 2/1996 | Ramesh et al. | 455/234.2 |
| 5,507,023 | 4/1996 | Suganuma et al. | 455/234.1 |
| 5,509,030 | 4/1996 | Mortensen | 375/232 |
| 5,535,238 | 7/1996 | Schilling et al. | 375/200 |
| 5,548,616 | 8/1996 | Mucke et al. | 375/295 |
| 5,566,201 | 10/1996 | Östman | 375/200 |
| 5,630,220 | 5/1997 | Yano | 455/234.1 |
| 5,631,921 | 5/1997 | Schilling | 375/200 |
| 5,644,590 | 7/1997 | Sugita | 375/200 |
| 5,697,081 | 12/1997 | Lyall, Jr. et al. | 455/249.1 |

*Primary Examiner*—Chi H. Pham
*Assistant Examiner*—Khai Tran
*Attorney, Agent, or Firm*—Robert E. Bushnell, Esq.

[57] ABSTRACT

A direct sequence spread spectrum communication system with a compact automatic gain controller for finely controlling a gain of a received signal. The automatic gain control device may be constructed with a reception signal gain controller for causing an radio frequency amplifier to function as an attenuator during a packet reception interval when the received signal has a level higher than a normal operating level, so as to attenuate a level of the received signal to the normal operating level, and for varying an output level of a local oscillator signal of an intermediate frequency converter upon receiving the received signal having a level which is equal to or lower than the normal operating level, so as to match an output level of an intermediate frequency signal generated by an intermediate frequency stage with an input level of a base band stage.

14 Claims, 6 Drawing Sheets

AUTOMATIC GAIN CONTROL IN DIRECT SEQUENCE SPREAD SPECTRUM COMMUNICATION SYSTEM

CLAIM OF PRIORITY

This application makes reference to, incorporates the same herein, and claims all benefits accruing under 35 U.S.C. § 119 from an application for AUTOMATIC GAIN CONTROL DEVICE AND METHOD IN DIRECT SEQUENCE SPREAD SPECTRUM COMMUNICATION SYSTEM earlier filed in the Korean Industrial Property Office on the 5$^{th}$ day of the month of October 1996 and there duly assigned Ser. No. 44154/1996.

BACKGROUND OF THE INVENTION

1. Field of the Invention

The present invention relates to a direct sequence spread spectrum communication system, and, more particularly, to an automatic gain control process and controller for automatically controlling a gain of a received signal.

2. Description of the Related Art

A direct sequence spread spectrum communication system transmits a signal by a packet unit and needs to maintain an optimal reception level during a received packet interval to minimize an interference caused in a modem at a base band. In particular, in case of a LAN (Local Area Network) used for a local communication, a communication system may receive an input signal whose intensity exceeds a maximum permissible reception level. Thus, it is necessary for the communication system to include a reception gain control circuit for appropriately controlling the high power input. Such an automatic gain control circuit is disclosed in U.S. Pat. No. 5,233,634 to Väisänen, issued on the 3$^{rd}$ of August, 1993, and entitled Automatic Gain Control Circuit In A Radio Telephone Receiver.

In these designs for direct sequence spread spectrum communication systems, most of the total gain control of the received signal is accomplished in the base band frequency sections, i.e. in the I and Q branches, where the signal amplification is controlled step by step, and only a minor part of the total gain control is performed in the radio frequency (RF) stage.

High amplification steps are formed by amplifiers, wherein the desired amplifier is activated by digitally controlled multiplexers, and low amplification steps are formed by resistance attenuators, in which a signal of a desired level is selected by digitally controlled multiplexers. In addition, an RF amplifier has two amplification levels and the desired amplification is selected by a digital control. With the different digital control combinations, the entire gain control range required of the receiver can be covered.

Exemplary designs suggested for contemporary circuits include those found in U.S. Pat. No. 5,168,505 to Akazawa et al., entitled Automatic Gain Control Device For Spread Spectrum Communication Device, U.S. Pat. No. 5,566,201 to Östman, entitled Digital AGC For A CDMA Radiotelephone, U.S. Pat. No. 5,644,590 to Sugita, entitled Spread spectrum Communication Apparatus And Signal Intensity Detection Apparatus, U.S. Pat. No. 5,347,534 to Akazawa et al., entitled Automatic Gain Control System, U.S. Pat. No. 4,899,364 to Akazawa et al., entitled Automatic Gain Control System, U.S. Pat. No. 4,953,178 to Ishigaki, entitled Spread Spectrum Communication System, U.S. Pat. No. 5,631,921 to Schilling, entitled Adaptive Power Control For A Spread Spectrum Communications System And Method, U.S. Pat. No. 5,535,238 to Schilling et al., entitled Spread Spectrum Adaptive Power Control Communications System And Method, U.S. Pat. No. 5,548,616 to Mucke et al., entitled Spread Spectrum Radiotelephone Having Adaptive Transmitter Gain Control, U.S. Pat. No. 5,276,685 to Kepler et al., entitled Digital Automatic Gain Control, U.S. Pat. No. 5,481,226 to Parkes Jr., entitled Low-Voltage Intermediate Frequency Amplifier Providing Automatic Gain Control Of A Source Amplifier, U.S. Pat. No. 5,630,220 to Yano, entitled Automatic Gain Control Circuit For Radio Communication Apparatus, U.S. Pat. No. 5,509,030 to Mortensen, entitled RF Receiver AGC Incorporating Time Domain Equalizer Circuitry, U.S. Pat. No. 5,507,023 to Suganuma et al., entitled Receiver With An AGC Circuit Capable Of Expanding A Dynamic Range, U.S. Pat. No. 5,493,712 to Ramesh et al., entitled Fast AGC For TDMA Radio Systems, and U.S. Pat. No. 5,438,683 to Automatic Level Control Circuit For Dual Mode Analog/Digital Cellular Telephone.

I have found however, the contemporary receiver designs need a controller in order to calculate very complex numerical formulae for a digital control of the signals, and a large number of serially-coupled amplifiers each having different gains for controlling the gain. Besides, the conventional automatic gain controller includes a plurality of the multiplexers and resistors with fixed resistances. Since the prior art device uses a large number of elements, the cost may increase undesirably and it may be difficult to realize a compact device. Further, since the amplifiers and the resistors have fixed gains and resistances, it may be difficult to finely control the gain.

SUMMARY OF THE INVENTION

It is therefore an object of the present invention to provide an automatic gain control for finely controlling a gain of a received signal in a direct sequence spread spectrum communication system.

It is another object to provide a compact automatic gain control device.

It is still another object to provide an automatic gain control for preventing a deterioration of a system performance due to a system saturation which may be caused when a received signal has too high a power.

It is further still another object to provide an automatic gain control for removing second and third order harmonics of a local oscillator to remove system noise.

According to an aspect of the present invention, an automatic gain control device of a receiver in a direct sequence spread spectrum communication system includes a reception signal gain controller for allowing an RF amplifier to function as an attenuator during a packet reception interval when the received signal has a level higher than a normal operating level, so as to attenuate a level of the received signal to the normal level, and for varying an output level of a local oscillator signal of an intermediate frequency converter upon receiving the received signal having a level which is equal to or lower than the normal operating level, so as to match an output level of an intermediate frequency signal generated from an intermediate frequency stage with an input level of a base band stage.

The automatic gain control device includes a low-pass filter to remove second and third harmonics of the local oscillator so as to remove system noise. Further, it is possible to finely control a gain of the received signal by using a plurality of filters, so as to provide an accurate signal level that the system requires. Besides, the automatic gain control device of the invention uses a plurality of low-pass filter stages, to easily control an attenuation of the received signal.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
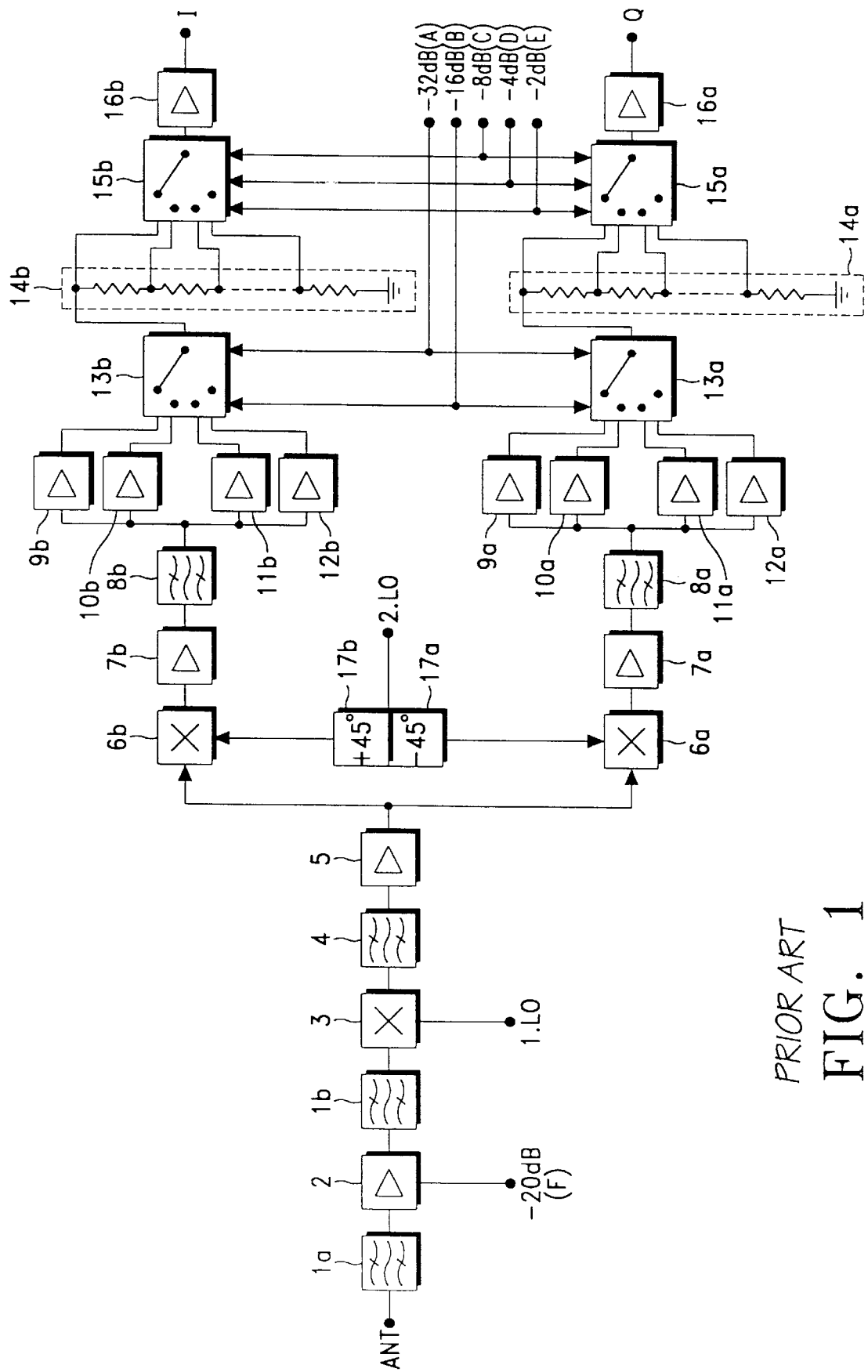
FIG. 1 is a diagram of an automatic gain control device according to the prior art.

A preferred embodiment of the present invention will be described in detail hereinbelow with reference to the attached drawings, in which the like reference numerals represent the like elements. Further, it should be clearly understood that many specifics such as the detailed circuit elements are shown only by way of an example to bring a better understanding of the present invention and the present invention may be embodied without those specifics. Moreover, it should be noted that detailed descriptions of the related prior art may have been intentionally omitted if they were believed to be unnecessary in describing the concepts of the present invention.

As is shown in FIG. 1, a received signal ANT emitted from the antenna is amplified after the filter 1a in an RF amplifier 2; the gain of which can be reduced by control F, e.g., by 20 dB. The signal filtered in the filter 1b is applied to a mixer 3, where it is mixed with a local a local oscillator frequency 1.Lo to produce an intermediate frequency that can be filtered from the mixing results thereof by a filter 4. The output of filter 4 is divided, after being amplified, by the intermediate amplifier 5, into two branches for producing I and Q signals.

In these branches, the I/Q signals (of sine and cosine shape) are produced in the mixers 6a and 6b by having the incoming signal mixed with the frequency signal 2Lo from the second local oscillator in the mixers, wherein the incoming local oscillator frequencies are 90 degrees phase shifted with respect to each other. The I and Q signals obtained as mixing results are amplified in amplifiers 7a and 7b, and the high frequencies are filtered from the amplified signals in filters 8a and 8b.

The signal path in both branches is divided into a plurality of branches, each of which being provided with an amplifier 91, 10a, 11a, 12a; 9b, 10b, 11b, 12b. In multiplexers 13a, 13b one amplifier may, in both branches at a time, be connected to the signal path, such as by a given multiplexer control for which the signal passes in the I branch through the amplifier 10b and in the Q branch through the amplifier 10a. Said amplifiers have equal gain.

Similarly, with different control of the multiplexers 13a, b the signals will pass through other amplifiers, said amplifiers always having the equal gain, two and two, but it is understood that the amplifiers 9a–12a of the Q branch have different gains, as have also the amplifiers 9b–12b of the I branch. The gain of the amplifiers 10a and 10b could be 50 dB, the gain of the amplifiers 11a and 11b could be 18 dB, and the gain of the amplifiers 12a and 12b could be 2 dB.

The above values are, in fact, gains of said amplifiers. When selecting with a multiplexer a signal of an amplifier branch, a given amplifying step is hereby selected, which means a relative change of the gain. For instance, a signal selected from the 50 dB amplifier corresponds to a 0 dB gain step, that is maximum gain, and a signal from the 2 dB amplifier corresponds to the −48 dB gain step. Selecting 34 dB and 18 dB amplifiers respectively is equivalent to gain steps −16 dB and −32 dB. Different gains may, of course, be used. The multiplexers are controlled using digital control signals A and B, with which the multiplexer can be directed into four different positions.

The signal route after the amplifiers is provided with an attenuator in both branches, most preferably a resistance attenuator composed of similar resistance networks 14a and 14b, among which a signal of desired size is selected by multiplexers 15a and 15b. Said multiplexers also receive their control from the control logic of the telephone. With three control signals C, D and E, one out of eight relative gain steps can be selected, and said steps may be, for instance 0 dB, −2 dB, −4 dB, −8 dB, −10 dB, −12 dB, and −14 dB. A given control signal combination C, D and E produces an amplification step of equal magnitude from the attenuators 14a and 14b. After the attenuators 14 a and 14b, the signals propagate through the amplifiers 16a and 16b to the output of the circuit. The gain of the amplifiers 16a and 16b could be 15 dB.

By controlling the multiplexers 13a, 13b, and 15a, 15b, altogether 32 different amplification step combinations can be obtained. The range may be further expanded by making the RF amplification 2 so controllable that its gain can be reduced by means of the logic control F, such as in the amount of 20 dB. For instance, an 84 dB power range can be covered with control signals A, B, C, D, E, F at 2 dB intervals.

Figure 2:
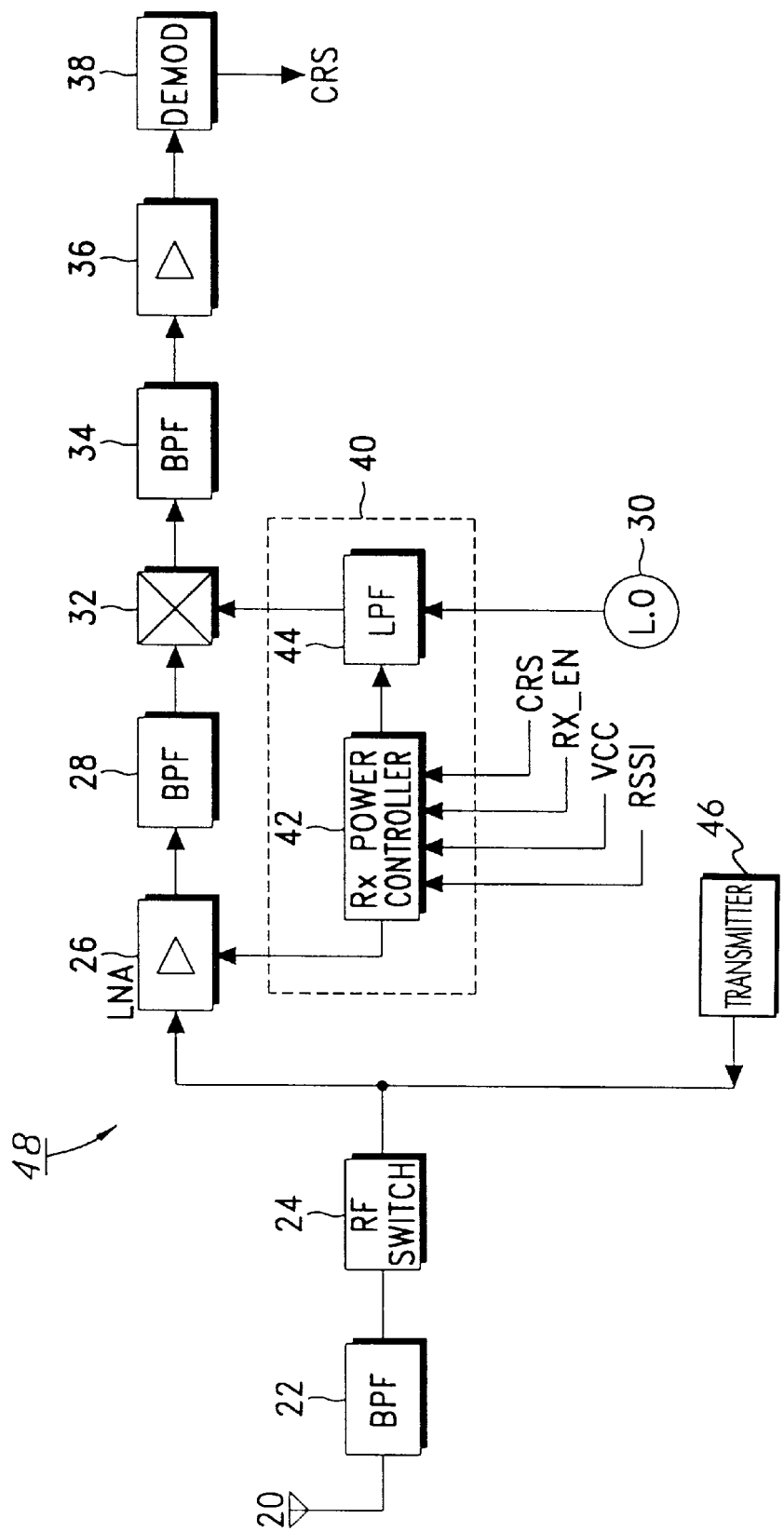
FIG. 2 is a diagram of a transmitter-receiver of a direct sequence spread spectrum communication system with an automatic gain control device constructed as an embodiment of the present invention.
Figure 3:
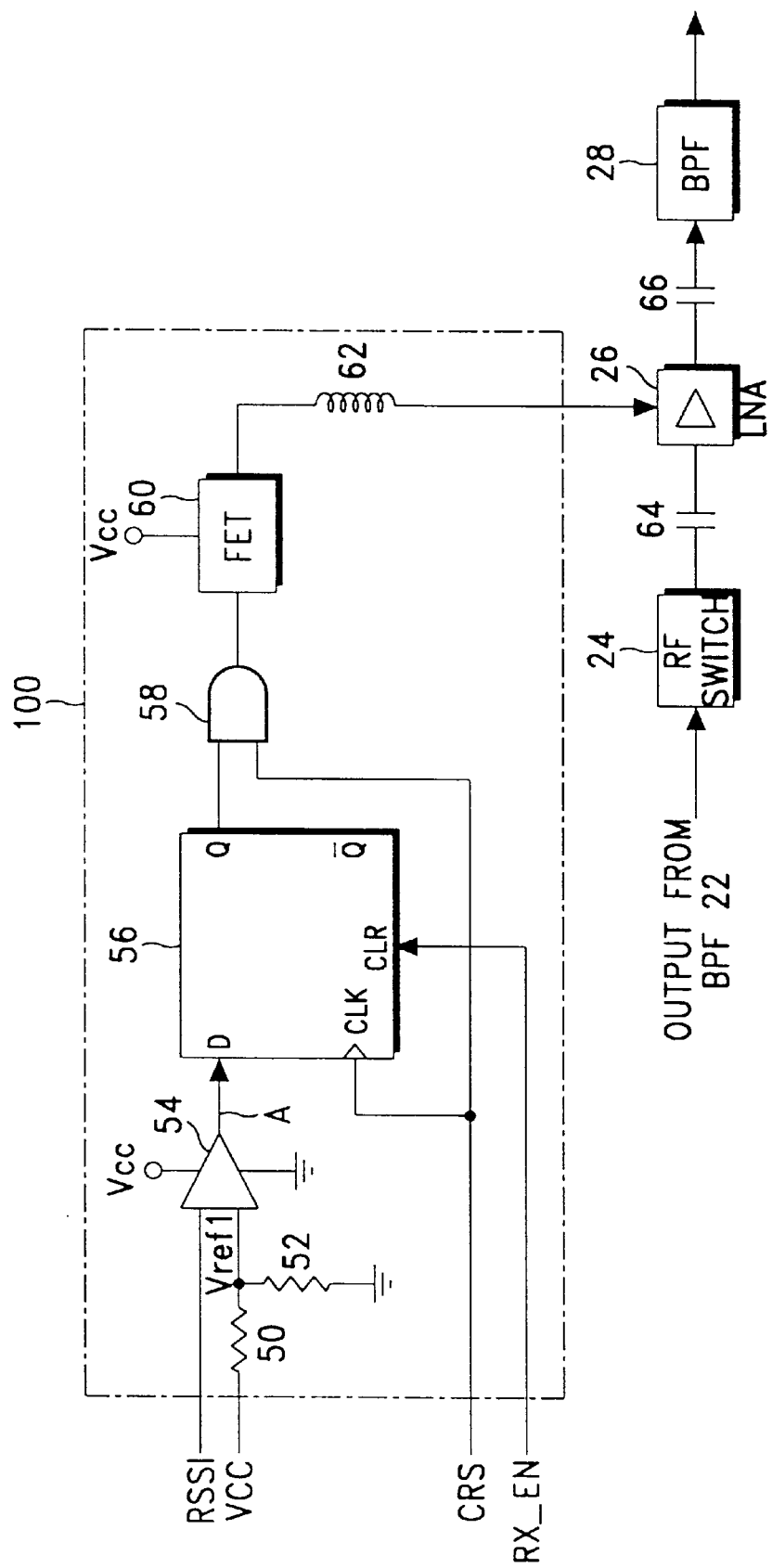
FIG. 3 is a detailed circuit diagram of a first reception power controller and associated peripheral circuits according to the present invention.
Figure 4:
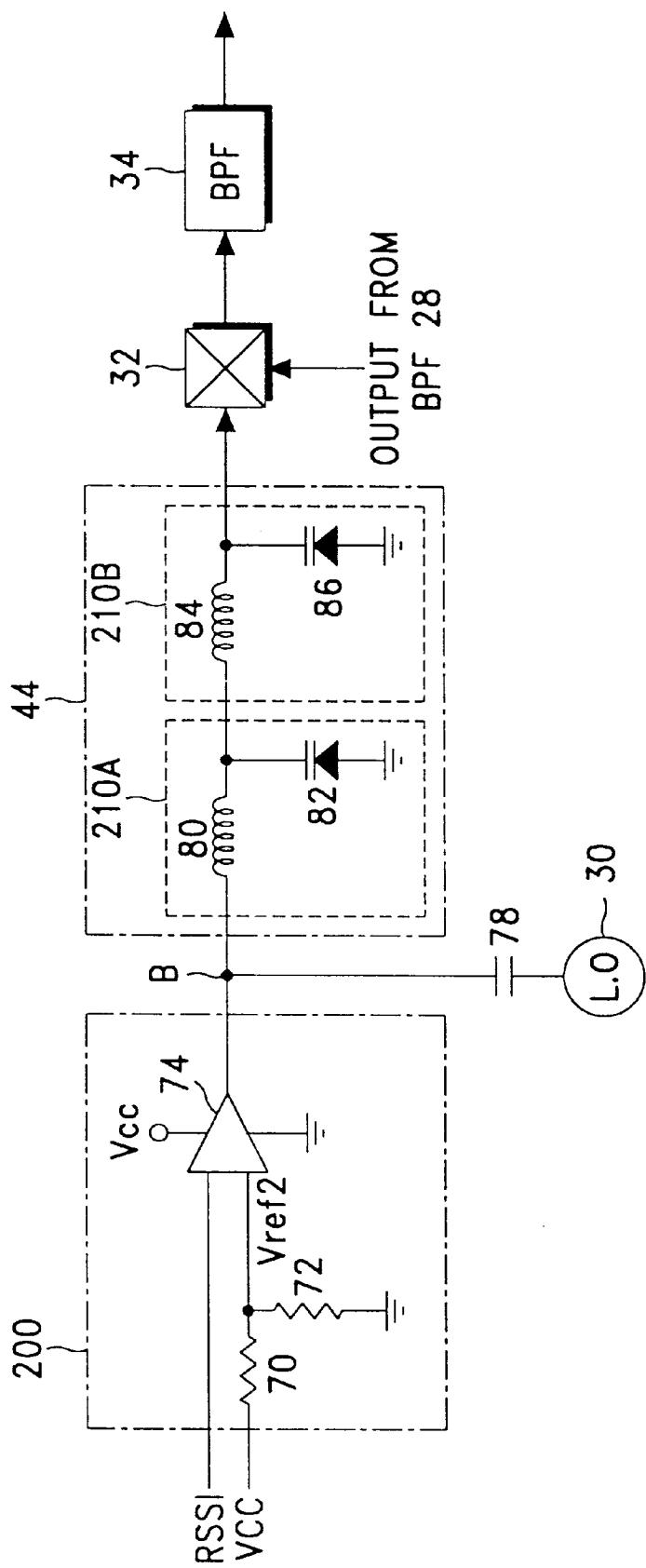
FIG. 4 is a detailed circuit diagram of a second reception power controller and associated peripheral circuits according to the present invention.

Referring to FIG. 2, a transmitter-receiver according to the present invention includes an antenna 20, a bandpass filter (BPF) 22, an RF switch 24, a transmitter 46 and a receiver 48. The RF switch 24, which is a single-pole-double-through switch, switches the system to the transmitter 46 or to the receiver 48. The receiver 48 includes an automatic gain controller according to the present invention. Specifically, the receiver 48 includes a low noise amplifier (LNA) 26, a bandpass filter (BPF) 28, a local oscillator 30, a mixer 32, a bandpass filter 34, an amplifier 36, a demodulator 38, and a reception signal gain controller 40. The reception signal gain controller 40 is composed of a reception power controller 42 and a low-pass filter (LPF) 44. The reception power controller 42 is composed of a first reception power controller 100 associated with the low noise amplifier 26 (as shown in FIG. 3) and a second reception power controller 200 associated with the low-pass filter 44 (as shown in FIG. 4). The low-pass filter 44 interposed between the local oscillator 30 and the mixer 32 is controlled by the second reception power controller 200.

An RF signal received through the antenna 20 is supplied to the low noise amplifier 26 via the bandpass filter 22 and the RF switch 24, and amplified by the low noise amplifier 26. In general, a gain G of the low noise amplifier 26 is determined under the conditions described as follows. That is, a value obtained by adding a power of the RF signal to an established gain of the low noise amplifier 26 should not exceed an output 1 dB suppression point P1dB. Further, an output power of the low noise amplifier 26 should not exceed a 1 dB input of the mixer 32. Further, in order to improve a system performance under the environment that various signals exists, the input signal should be established so as not to exceed the P1dB corresponding to a third input interception point IIP3. The low noise amplifier 26 has:

Operating Range of Signal=IP1dB−MDS (Minimum Discrimination Signal), (1)

and

Spurious Free Operating Range=⅔(IIP3−MDS) (2)

Therefore, the gain G of the low noise amplifier 26 should be established in the light of the foregoing. On the other hand, the reception power controller 42 is composed of the first reception power controller 100 and the second reception power controller 200. The first reception power controller 100 controls an RF amplifier, i.e., the low noise amplifier 26 during a packet receiving interval when the RF signal of the high level (or high power) is received, so as to attenuate a level of the RF signal. Here, the high level RF signal refers to the RF signal that exceeds the P1dB, and is commonly generated in a short distance communication such as a LAN.

Referring to FIG. 3, there is illustrated a detailed circuit diagram of the first reception power controller 100, in which a magnitude of the received RF signal, i.e., a received signal strength indicator (RSSI) level, is supplied to an input of comparator 54. Another input of comparator 54 is coupled to a reference voltage Vref1 which is determined by dividing the supply voltage VCC by resistors 50 and 52, assuming that the comparator 54 has a high input resistance as compared with the resistances of the resistors 50 and 52. Thus, if the RSSI level of the received RF signal is higher than the reference voltage Vref1, the comparator 54 will generate a logic "high" level at an output node A thereof. If the RSSI level of the received RF signal is lower than the reference voltage Vref1 however, comparator 54 will generate a logic "low" level at the output terminal A. The output terminal A of comparator 54 is connected to an input terminal D of a D flip-flop 56 having a clock terminal CLK coupled to a carrier sensing signal CRS generated by demodulator 38 (operating at a base band stage) upon sensing the carrier. The carrier sensing signal CRS is also supplied to an input of an AND gate 58. The D flip-flop 56 generates a logic "low" level at an output terminal Q thereof, in response to a reception enable signal RX_EN. The D flip-flop 56 delivers the logic level at the input terminal D to another input of the AND gate 58 via the output terminal Q, in response to the carrier sensing signal CRS (of a logic "high" level).

The AND gate 58 generates a logic "high" level fed to a field effect transistor (FET) 60, when the carrier sensing signal CRS and an output of the AND gate 58 are all at a logic "high" level. The FET 60, which is a p-channel transistor, becomes nonconductive, when the output of the AND gate 58 is at a logic "high" level. If the FET 60 becomes nonconductive, the supply voltage VCC being supplied to the low noise amplifier 26 via the FET 60 will be cut off. Then, the low noise amplifier 26 functions as an attenuator to prevent the system saturation due to the high power input. On the contrary, the low noise amplifier 26 normally operates to amplify the received RF signal input, when the RSSI level does not correspond to the high power input or when the carrier sensing signal CRS is at a logic "low" level.

It should be noted that the D flip-flop 56 is used to prevent the output of the comparator 54 from fluctuating due to a ripple signal which may be generated for a short time (commonly a few milliseconds) as long as a packet signal length upon receiving a packet signal. Further, the AND gate 58 ANDs the carrier sensing signal CRS and the output of the D flip-flop 56, so as to prevent a misoperation due to noise which may be input via a path through which the RSSI level is received.

Further, an inductor 62 is interposed between the FET 60 and the low noise amplifier 26, so as to provide the low noise amplifier 26 with DC components of the supply voltage VCC, exclusively. Besides, as illustrated, a coupling capacitor 64 is connected between the RF switch 24 and the low noise amplifier 26, and a coupling capacitor 66 is connected between the low noise amplifier 26 and the bandpass filter 28.

Referring back to FIG. 2, if the received RF signal input is a high power signal, the high power RF signal input will be adjusted into a normal level by the low noise amplifier 26. If the received RF signal input is at a normal level or lower than the normal signal level however, the received RF signal will be normally amplified at the low noise amplifier 26 and supplied to the mixer 32 via the bandpass filter 28. The mixer 32 converts the received signal into an intermediate frequency signal. The mixer 32, which is commonly composed of a diode mixer, has a conversion gain which is variable according to an output level of the local oscillator signal generated by the local oscillator 30. Thus, the received signal will be matched with the input level of the bandpass filter 34.

Now, detailed descriptions follow on operations of the automatic gain control device of the present invention with reference to FIGS. 2 and 4 through 7. It is noted from a voltage-current characteristic of a common diode that a current I flowing through the diode is represented by Equation (1), $$I = I_S(e^{\alpha V} - 1), \quad \alpha = \frac{q}{nkT} \quad (3)$$

where $I_S$=saturation current, n=ideal constant based on the diode structure, k=Boltzmann constant, and T=absolute temperature (°K).

Figure 6:
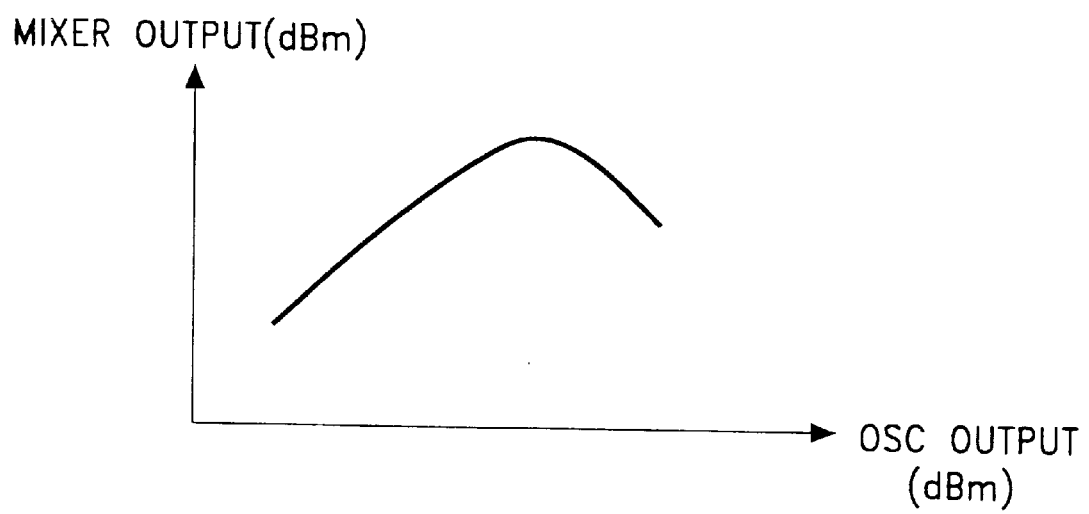
FIG. 6 illustrates a characteristic curve showing an output level of a diode mixer with respect to an output level of a local oscillator.

Therefore, the common diode mixer has a characteristic which is variable according to the input voltage (or input power), as shown in FIG. 6, in which the output level becomes lowered starting from a maximum output voltage (power) point. FIG. 6 illustrates a characteristic curve showing an output level of a diode mixer 32 with respect to an output level of the oscillator 30.

In accordance with the principles of the present invention, the output of the local oscillator 30 is controlled so as to match the output of the mixer 32 with an optimal input level of the bandpass filter 34. The output of the local oscillator 30 is controlled by the second reception power controller 200 in the reception power controller 42, and the low-pass filter 44.

Referring to FIG. 4, there is illustrated the second reception power controller 200 and the low-pass filter 44 associated with the peripheral circuit according to the present invention. As illustrated, a differential amplifier 74 has an input coupled to the RSSI level and another input coupled to a fine adjusting reference voltage Vref2 determined by dividing the supply voltage VCC by resistors 70 and 72. The fine adjusting reference voltage Vref2 has a reference level corresponding to the RSSI level when the received signal is lower than the minimum discrimination signal MDS.

The differential amplifier 74 subtracts the fine adjusting reference voltage Vref2 from the RSSI level (i.e., RSSI-Vref2), and generates an output voltage value thereof at an output node B. Thus, if the RSSI level is higher than the fine adjusting reference voltage Vref2, the differential amplifier 74 will generate the output voltage value of 'RSSI-Vref2'. If the RSSI level is lower than the fine adjusting reference voltage Vref2 however, the differential amplifier 74 will generate the output voltage of '0'.

The output voltage of the differential amplifier 74 is supplied to varactor diodes (or variable-capacitance diodes) 82 and 86 of the low-pass filter 44, so as to vary the cut-off frequency of the low-pass filter 44. The low-pass filter 44 is composed of a low-pass filter 210A and low-pass filter 210B. The low-pass filter 210A includes an inductor 80 connected to the varactor diode 82; and the low-pass filter 210B includes an inductor 84 connected to the varactor diode 86. The cut-off frequency of the low-pass filter 44 is represented by the following Equation (4).

$$\text{Cut-off Frequency} = \frac{1}{2\pi\sqrt{LC}} \quad (4)$$

where L and C represent an inductance of the inductors and a capacitance of the varactor diodes in the low-pass filter 44, respectively.

Figure 7:
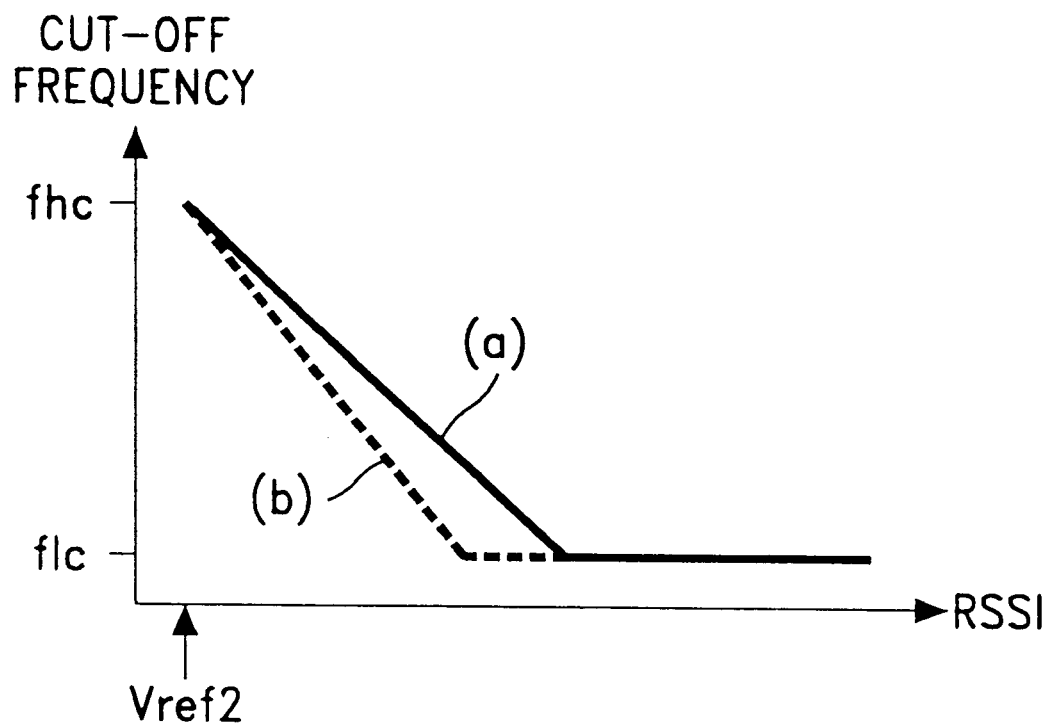
FIG. 7 illustrates a characteristic curve showing the cut-off frequency of the low-pass filter with respect to an RSSI level.

The output voltage value of the differential amplifier 74 varies the capacitance C of the low-pass filter 44. It can be understood from Equation (4) that as the output voltage value of the differential amplifier 74 increases (i.e., as the capacitance of the varactor diode increases), the cut-off frequency of the low-pass filter 44 decreases. On the contrary, as the output voltage value of the differential amplifier 74 decreases, the cut-off frequency increases. If the output voltage value of the differential amplifier 74 is 'O', the cut-off frequency will have an infinite value. If the RSSI-Vref2 output voltage value of the differential amplifier 74 exceeds a predetermined value however, the cut-off frequency of the low-pass filter 44 will be set to a minimum critical cut-off value $f_{lc}$, If the output voltage value of the differential amplifier 74 is 'O', the cut-off frequency will be set to a maximum critical cut-off value $f_{hc}$. FIG. 7 illustrates a characteristic curve showing the cut-off frequency of the low-pass filter 44 with respect to the RSSI level.

Figure 5:
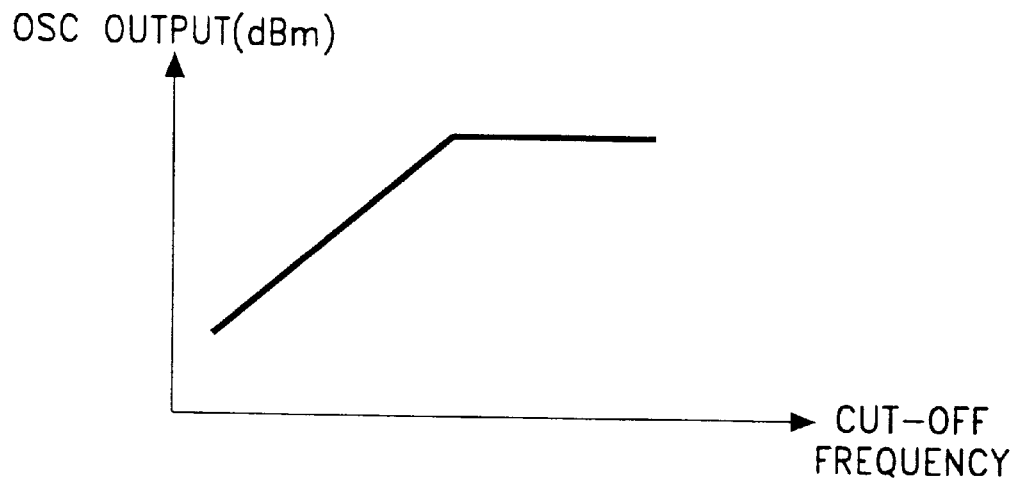
FIG. 5 illustrates a characteristic curve showing an output level of a local oscillator with respect to a cut-off frequency of a low-pass filter.

As indicated by FIG. 7, as the RSSI level increases, the cut-off frequency of the low-pass filter 44 decreases. If the cut-off frequency of the low-pass filter 44 decreases, the output level of the local oscillator 30 decreases as shown in FIG. 5 which illustrates a characteristic curve showing the output level of the local oscillator 30 with respect to the cut-off frequency of the low-pass filter 44. Further, if the RSSI level decreases, the cut-off frequency of the low-pass filter 44 increases, which results into an increase of the output level of the local oscillator 30 as shown in FIG. 5. Accordingly, since the local oscillator signal supplied to the diode mixer 32 has an output level which is in inverse proportion to a power of the received signal, the diode mixer 32 mixes the RF signal input received through the bandpass filter 28 with the local oscillator signal. Thus, the output level of the diode mixer 32 is matched to the input level of the bandpass filter 34.

Referring now to FIG. 4, the low-pass filter 44 is used to remove the second and third harmonics of the local oscillator signal generated by the local oscillator 30, so as to remove the system noise. Further, since an attenuation characteristic of the low-pass filter 44 is linear, it is possible to finely adjust the level. Besides, since the attenuation of the low-pass filter 44 increases by three decibels (dB) whenever adding one LC filter, a desired gain can be freely adjusted by simply determining the number of the LC filter stages. For example, curve (a) of FIG. 7 illustrates the characteristic curve in case of using two LC filter stages, and curve (b) of FIG. 7 illustrates the characteristic curve in case of using three LC filter stages.

Although a preferred embodiment of a receiver constructed in accordance with the principles of the present invention with an automatic gain control for finely controlling the gain of a received signal in a direct sequence spread spectrum communication system has been described in detail in the foregoing paragraphs. It should be clearly understood therefore, that many variations and modifications of the basic concepts taught herein which may appear to those skilled in the art will still fall within the spirit and scope of the present invention as defined in the appended claims.

What is claimed is:

1. An automatic gain control device of a receiver in a direct sequence spread spectrum communication system, comprising:

a reception signal gain controller for causing a radio frequency amplifier to function as an attenuator during a packet reception interval when a received signal has a signal level higher than a predetermined normal operating level, said radio frequency amplifier attenuating said signal level of said received signal to said normal operating level and for varying an output level of a local oscillator signal of an intermediate frequency converter upon receiving said received signal having a signal level equal to or lower than said normal operating level, so as to match an output level of an intermediate frequency signal generated by an intermediate frequency stage with an input level of a base band stage;

said reception signal gain controller comprising:
a first reception power controller for cutting off a supply voltage being supplied to said radio frequency amplifier during a packet reception interval when said received signal has a level higher than said normal operating level, thereby causing said radio frequency amplifier to function as an attenuator;
a second reception power controller for comparing said received signal with a fine adjusting reference voltage when said received signal has a level equal to or lower than said normal operating level and for generating an output voltage in response thereto; and
a low-pass filter for varying a cut-off frequency thereof according to said output voltage of said second reception power controller, for controlling said output level of said local oscillator signal according to variations of said cut-off frequency.

2. An automatic gain control device of a receiver according to claim 1, said low-pass filter comprising at least one inductive-capacitive filter stage whose capacitance is varied in accordance with said output level of said second reception power controller.

3. An automatic gain control device of a receiver according to claim 1, said low-pass filter comprising an inductor and a varactor diode.

4. An automatic gain control device of a receiver according to claim 1, said first reception power controller comprising:
   a comparator for comparing a received signal strength indication level with a first reference voltage corresponding to the received signal strength indication level when the received signal has a signal level higher than said normal operating level;
   a latch for latching an output of said comparator for a packet reception interval; and
   a voltage supply controller for cutting off said supply voltage being supplied to said radio frequency amplifier according to an output of said latch.

5. An automatic gain control device of a receiver according to claim 4, said voltage supply controller comprising a field effect transistor for cutting off said supply voltage when said received signal strength indication level is higher than said first reference voltage.

6. An automatic gain control device of a receiver according to claim 1, said second reception power controller comprising a differential amplifier for amplifying a voltage difference between said received signal strength indication level being equal to or lower than said normal operating level and a second reference voltage corresponding to a received signal strength indication level of a minimum discrimination signal, and for providing said low-pass filter with an output corresponding thereto.

7. An automatic gain control device of a receiver according to claim 2, said second reception power controller comprising a differential amplifier for amplifying a voltage difference between said received signal strength indication level being equal to or lower than said normal operating level and a second reference voltage corresponding to a received signal strength indication level of a minimum discrimination signal, and for providing said low-pass filter with an output corresponding thereto.

8. An automatic gain control device of a receiver according to claim 3, said second reception power controller comprising a differential amplifier for amplifying a voltage difference between said received signal strength indication level being equal to or lower than said normal operating level and a second reference voltage corresponding to a received signal strength indication level of a minimum discrimination signal, and for providing said low-pass filter with an output corresponding thereto.

9. A method of automatically controlling gain in a receiver in a direct sequence spread spectrum communication system, comprising the steps of:
   causing a radio frequency amplifier to function as an attenuator during a packet reception interval when a received signal has a signal level higher than a predetermined normal operating level, attenuating said signal level of said received signal to said normal operating level with said radio frequency amplifier, and varying an output level of a local oscillator signal of an intermediate frequency converter upon receiving said received signal having a signal level equal to or lower than said normal operating level, so as to match an output level of an intermediate frequency signal generated by an intermediate frequency stage with an input level of a base band stage;
   cutting off a supply voltage being supplied to said radio frequency amplifier during a packet reception interval when said received signal has a level higher than said normal operating level with a first reception power controller, thereby causing said radio frequency amplifier to function as an attenuator;
   comparing said received signal with a fine adjusting reference voltage when said received signal has a level equal to or lower than said normal operating level and generating an output voltage in response thereto with a said reception power controller; and
   varying a cut-off frequency thereof according to said output voltage of said second reception power controller, controlling said output level of said local oscillator signal according to variations of said cut-off frequency with a low pass filter.

10. A method of automatically controlling gain in a receiver according to claim 9, further comprising the step of varying a capacitance of said low-pass filter comprising at least one inductive-capacitive filter stage in accordance with said output level of said second reception power controller.

11. A method of automatically controlling gain in a receiver according to claim 9, further comprising the steps of:
   comparing a received signal strength indication level with a first reference voltage corresponding to the received signal strength indication level when the received signal has a signal level higher than said normal operating level in the first reception power controller;
   latching an output of said comparator for a packet reception interval in the first reception power controller; and
   cutting off said supply voltage being supplied to said radio frequency amplifier according to the latched output.

12. A method of automatically controlling gain of a receiver according to claim 11, further comprising the step of cutting off said supply voltage when said received signal strength indication level is higher than said first reference voltage with a field effect transistor.

13. A method of automatically controlling gain of a receiver according to claim 9, further comprising the steps of amplifying a voltage difference between said received signal strength indication level being equal to or lower than said normal operating level and a second reference voltage corresponding to a received signal strength indication level of a minimum discrimination signal in a differential amplifier, and providing said low-pass filter with an output corresponding thereto.

14. A method of automatically controlling gain of a receiver according to claim 10, further comprising the steps of amplifying a voltage difference between said received signal strength indication level being equal to or lower than said normal operating level and a second reference voltage corresponding to a received signal strength indication level of a minimum discrimination signal in a differential amplifier, and providing said low-pass filter with an output corresponding thereto.

* * * * *